(12) United States Patent
Goel et al.

(10) Patent No.: US 9,251,889 B2
(45) Date of Patent: Feb. 2, 2016

(54) AREA-EFFICIENT, HIGH-SPEED, DYNAMIC-CIRCUIT-BASED SENSING SCHEME FOR DUAL-RAIL SRAM MEMORIES

(71) Applicant: LSI Corporation, San Jose, CA (US)

(72) Inventors: Ankur Goel, Bangalore (IN); Dharmendra Kumar Rai, Bangalore (IN); Sumith Kaippalathingal Soman, Bangalore (IN)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/510,214

(22) Filed: Oct. 9, 2014

(65) Prior Publication Data

US 2015/0206578 A1    Jul. 23, 2015

(30) Foreign Application Priority Data

Jan. 21, 2014    (IN) .............................. 266/CHE/2014

(51) Int. Cl.
*G11C 7/02* (2006.01)
*G11C 11/419* (2006.01)
*G11C 11/418* (2006.01)

(52) U.S. Cl.
CPC ............ *G11C 11/419* (2013.01); *G11C 11/418* (2013.01)

(58) Field of Classification Search
CPC .............................. G11C 11/4076; G11C 8/08
USPC ..................... 365/205, 189.09, 233.1, 189.11
See application file for complete search history.

(56) References Cited

U.S. PATENT DOCUMENTS

| | | | | |
|---|---|---|---|---|
| 6,178,122 B1 * | 1/2001 | Tomishima et al. | ...... | G11C 8/08 365/185.11 |
| 2002/0141245 A1 * | 10/2002 | Kuroki | ............... | G11C 11/4096 365/189.05 |
| 2010/0091551 A1 * | 4/2010 | Hosono et al. | ...... | G11C 13/0004 365/148 |

* cited by examiner

*Primary Examiner* — Tuan T Nguyen
(74) *Attorney, Agent, or Firm* — Sheridan Ross P.C.

(57) ABSTRACT

In one embodiment, a self-timed, dual-rail SRAM includes a self-timing circuit having a logic gate that is powered by voltage VDD and configured to receive a fire-sense-amplifier timing signal and to produce a VDD-domain sense-amplifier-enable signal SOELV. The self-timing circuit includes an inverting level-shifter having complementary N-type and P-type transistors connected in series between voltage VDDA and ground. The N-type transistor's gate is connected to signal SOELV, and both transistors' drain terminals are connected together to produce output signal SOEHVB. The inverting level-shifter also includes two series-connected P-type transistors connected (i) between supply voltage VDDA and the output and (ii) in parallel with the first P-type (pull-up) transistor. An inverter is connected between the output node and the control terminal of one of the series transistors, and the other series-transistor's gate is connected to signal SOELV. Thus, the series transistors provide a rapid latching and latch-breaking function.

20 Claims, 8 Drawing Sheets

AREA-EFFICIENT, HIGH-SPEED, DYNAMIC-CIRCUIT-BASED SENSING SCHEME FOR DUAL-RAIL SRAM MEMORIES

CROSS-REFERENCE TO RELATED APPLICATIONS

This application claims the benefit of Indian Patent Application No. 266/CHE/2014 filed Jan. 21, 2014, the entire contents of which are incorporated herein by reference.

BACKGROUND OF THE INVENTION

1. Field of the Invention

The present invention relates to electrical circuits, and, more specifically but not exclusively, to timing circuits in integrated memory circuits, and still more specifically, to timing circuits having a level-shifting circuit.

2. Description of the Related Art

Modern integrated-circuit (IC) design techniques have greatly increased the quantity of transistors on integrated memory circuits and have improved power consumption, e.g., by reducing supply voltages. However, these same techniques have tended to reduce the performance, reliability, and yield of integrated memory circuits due to low supply voltages, threshold-voltage mismatch caused by process variations, etc. As a result, static random-access-memory (SRAM) devices are now commonly designed to operate from at least two supply-voltage sources (a.k.a. "dual rails" or "dual-power rails"). For example, memory cells and word-line drivers on such a device operate at a higher voltage than other electrical components on the device, in order to obtain improved speed, data reliability, and high yields. The other electrical components operate at a lower voltage, in order to reduce leakage currents and power consumption. (See, e.g., U.S. Pat. No. 7,952,939 B2; U.S. Pat. No. 8,164,971 B2; U.S. Pat. No. 8,208,318 B2; U.S. Pat. No. 8,427,888 B2; and U.S. Pat. No. 8,488,396 B2, U.S. Patent Publication No. US 2013/0128655 A1, and Y. H. Chen et al., "A 0.6V 45 nm Adaptive Dual-rail SRAM Compiler Circuit Design for Lower VDD_min VLSIs," 2008 Symposium on VLSI Circuits Digest of Technical Papers, the teachings of all of which are incorporated herein by reference.)

FIG. 1 depicts a schematic diagram of prior-art SRAM 110 implemented in integrated circuit 100. Integrated circuit 100 also comprises logic 120 powered by a supply voltage VDD. SRAM 110 comprises memory array 111 with a plurality of memory cells, level-shifter array 112, word-line (WL) decoder 113 for decoding the address signals to obtain "predecode" signals, control unit 114 for controlling the read/write operations, and input/output (I/O) unit 115 for receiving and transmitting data between the SRAM 110 and logic 120. In addition, various address, clock, and read/write control signals are provided between control unit 114 and logic 120. In order to avoid read/write failures for SRAM 110, the memory array 111 is powered by supply voltage VDDA, which is at a higher voltage level than supply voltage VDD. Word-line decoder 113, control unit 114, and I/O unit 115 are powered by supply voltage VDD, in order to save power. Accordingly, level-shifter array 112 is disposed between word-line decoder 113 and memory array 111, in order to change the voltage levels of signals generated by word-line decoder 113 from the voltage domain of supply voltage VDD to the voltage domain of supply voltage VDDA.

FIG. 2 depicts prior-art word-line driver array 200 having a plurality of dual-power-rail drivers. Word-line driver array 200 is coupled between word-line decoder 202 powered by supply voltage VDD and memory array 204 powered by supply voltage VDDA. Word-line decoder 202 provides a segment signal $S_{segment}$ to indicate that one section of the SRAM corresponding to the address signals has been selected. Word-line decoder 202 further provides a plurality of predecode signals (e.g., predecode[0], predecode[1], predecode[2], etc.) to word-line driver array 200 according to the address signals. Each dual-power-rail driver generates a word-line signal according to the corresponding predecode signal and the segment signal $S_{segment}$. In word-line driver array 200, each word-line driver 210, 220, 230 includes a corresponding level-shifter 212, 222, 232 and inverter 214, 224, 234 disposed in the data transmission path. Each level-shifter converts the corresponding received signal from the VDD domain to the VDDA domain.

SUMMARY OF THE INVENTION

The present inventors have identified a significant problem that arises when one attempts to power a sense amplifier on an integrated memory circuit from a higher supply voltage (e.g., VDDA), rather than from a lower supply voltage (e.g., VDD) of the integrated memory circuit. The sense amplifier receives a trigger signal (e.g., a sense-amplifier-enable signal) from a self-timing control circuit comprising CMOS (complementary metal-oxide semiconductor) logic circuits. As such, the self-timing control circuit is powered from the lower supply voltage VDD, while the sense amplifier is powered from the higher supply voltage VDDA. Accordingly, a level-shifter and an inverter are inserted between the self-timing control circuit and the sense amplifier. The presence of the level-shifter and the inverter, however, delay the arrival at the sense amplifier of the trigger signal generated by the self-timing control circuit. The delayed trigger signal causes the sense amplifier to read the bit-line signal from the memory cells later than it should.

The problem identified above is addressed in accordance with the principles of the present invention by providing a novel high-speed, low-latency, inverting level-shifter between the self-timing control circuit and the sense amplifier. By reducing the number of circuit elements in the self-timing-signal path, and by increasing the operating speed of the level-shifter, the trigger-signal delay described above is significantly improved.

Thus, one embodiment of the present invention is an integrated memory circuit comprising a sense-amplifier control circuit connected to a first supply voltage (e.g., VDD) and configured to receive a first timing signal (e.g., fire-sense-amplifier signal FSA) and to produce a second timing signal having a first maximum voltage (e.g., VDD) based on the first timing signal. An inverting level-shifter is connected to the sense-amplifier control circuit and is configured to produce a third timing signal that (i) inversely corresponds to the second timing signal and (ii) has a second maximum voltage (e.g., VDDA). A sense amplifier is connected to (i) a second supply voltage (e.g., VDDA), (ii) the inverting level-shifter, and (iii) at least one bit line, and is configured to amplify a bit-line signal (e.g., BLT, BLB) based on the third timing signal.

Another embodiment of the present invention is a method for controlling sense-amplifier timing in an integrated memory circuit. A sense-amplifier control circuit receives a first timing signal (e.g., fire-sense-amplifier signal FSA) and produces a second timing signal having a first maximum voltage (e.g., VDD) based on the first timing signal. An inverting level-shifter produces a third timing signal that (i) inversely corresponds to the second timing signal and (ii) has a second maximum voltage (e.g., VDDA). A sense amplifier amplifies a bit-line signal (e.g., BLT, BLB) based on the third timing signal.

Still another embodiment of the present invention is an inverting level-shifter, which comprises a first transistor that is (i) configured to receive a first signal having a first maximum voltage (e.g., VDD) supplied from a first supply voltage (e.g., VDD) and (ii) connected between a second supply voltage (e.g., VSS or ground) and an output node. A second transistor is connected to a second supply voltage (e.g., VDDA) and to the first transistor at the output node. A third transistor is connected in series with a fourth transistor, the combination of the third and fourth transistors being connected between the second supply voltage and the output node in parallel with the second transistor. An inverter is connected between the output node and the control terminal of the third transistor. The inverting level-shifter is configured to produce a second signal that inversely corresponds to the first signal and has a second maximum voltage (e.g., VDDA).

BRIEF DESCRIPTION OF THE DRAWINGS

The above embodiment(s) and additional embodiments are described in the following detailed description, the appended claims, and the accompanying drawings in which like reference numerals identify similar or identical elements.

DETAILED DESCRIPTION

Figure 1:
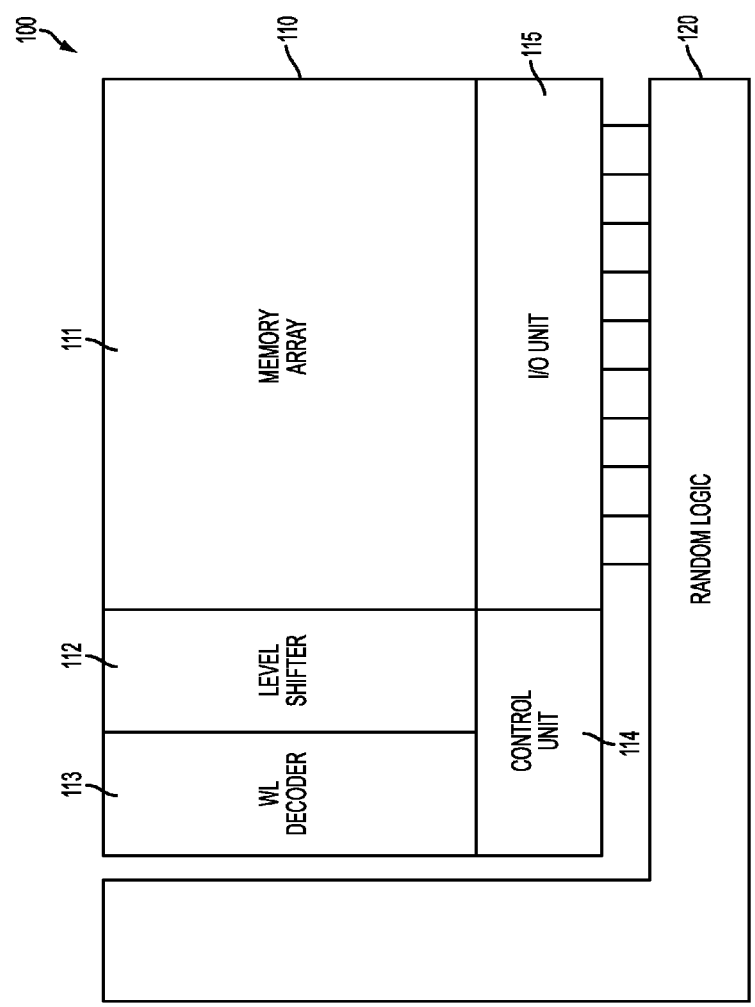
FIG. 1 is a block diagram of a prior-art, dual-rail integrated memory circuit having multiple supply-voltage regions.
Figure 2:
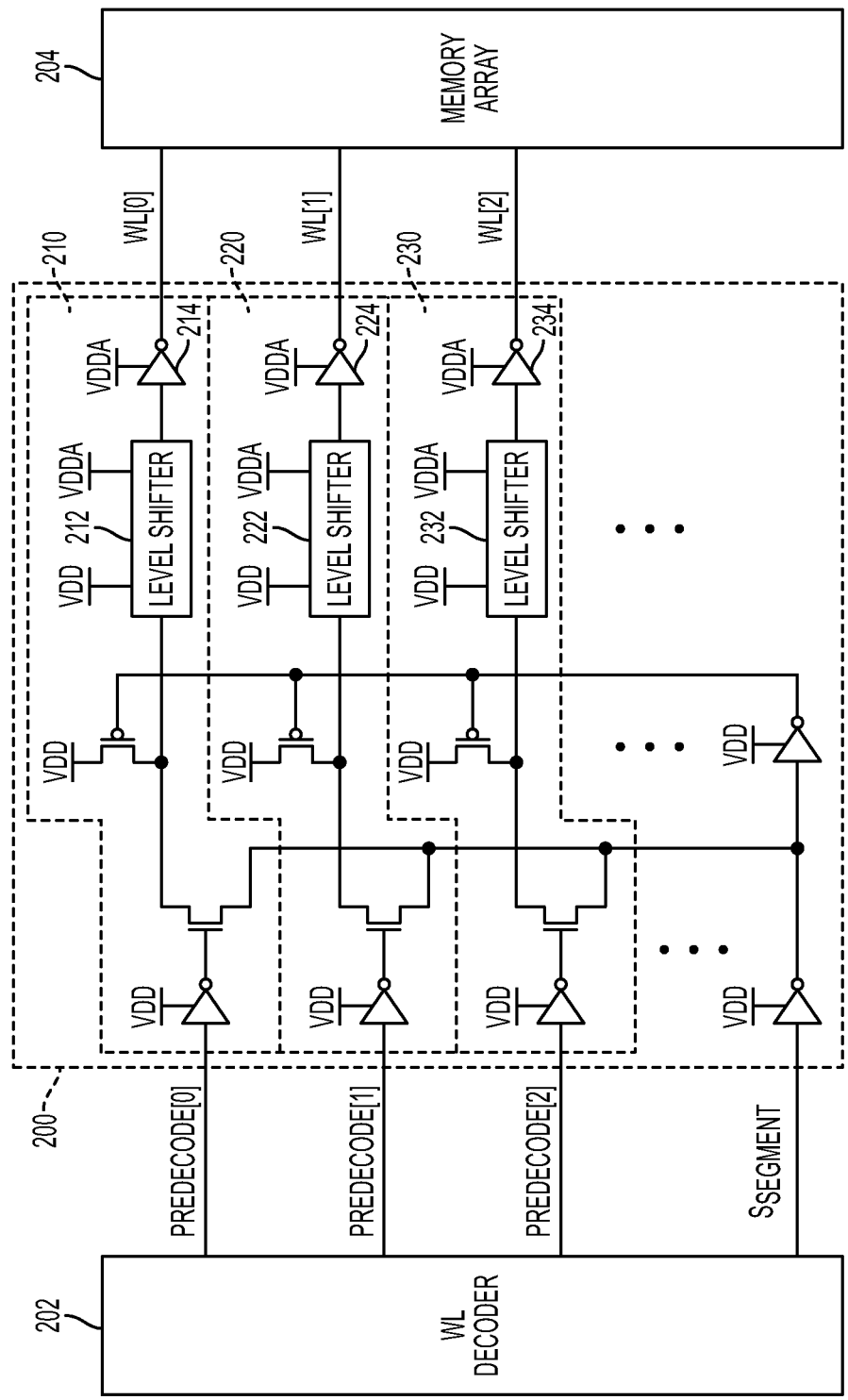
FIG. 2 is a schematic diagram of a prior-art, dual-rail, word-line driver array having a plurality of level-shifters and inverters.
Figure 3:
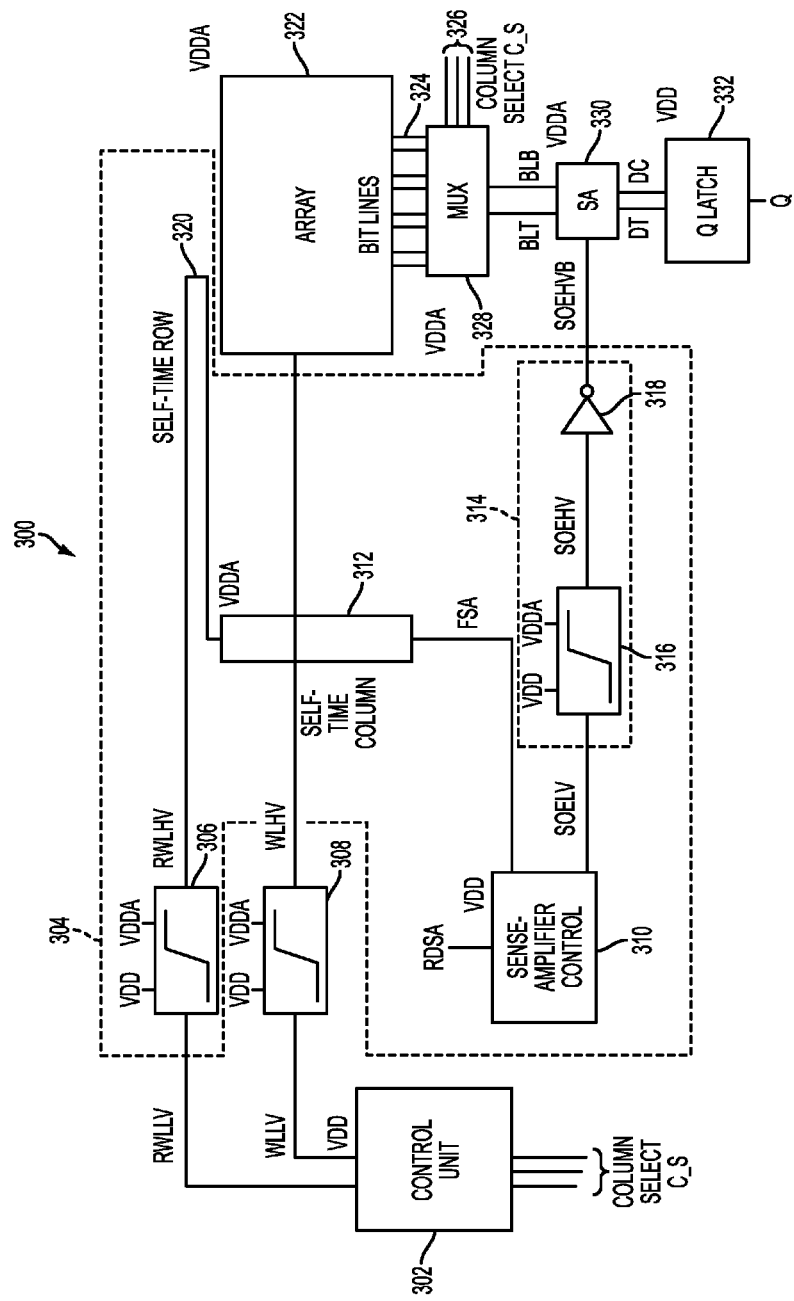
FIG. 3 is a block diagram of a self-timed, dual-rail SRAM comprising a self-timing circuit including a level-shifter and an inverter.

FIG. 3 depicts self-timed, dual-rail SRAM 300 comprising a memory-cell array 322, column-selection multiplexer 328, sense amplifier 330, Q-type latch 332, self-timing circuit 304, and SRAM control unit 302. Self-timing circuit 304 is connected between SRAM control unit 302 and sense amplifier 330. Self-timing circuit 304 comprises level-shifter 306, self-timing row 320, self-timing column 312, sense-amplifier-control unit 310, level-shifter 316, and inverter 318.

SRAM 300 is powered by one or more voltage sources (not shown) that provide a first supply voltage VDD and a second supply voltage VDDA, where supply voltage VDDA is greater than supply voltage VDD. In order to reduce leakage currents and power consumption, SRAM control unit 302, sense-amplifier-control unit 310, and latch 332 are connected to, and are powered from, supply voltage VDD. In order to achieve high performance and high yields, however, memory-cell array 322, multiplexer 328, sense amplifier 330, and self-timing column 312 are connected to, and are powered from, supply voltage VDDA.

Accordingly, SRAM 300 comprises three level-shifters 306, 308, and 316, which step up the voltage of signals outputted from SRAM control unit 302 and sense-amplifier control unit 310 from voltage VDD to voltage VDDA.

In order to perform a read operation, SRAM control unit 302 generates, inter alia, a VDD-domain word-line signal WLLV and a VDD-domain reference-word-line signal RWLLV, each having a voltage level that is either zero volts or the voltage of voltage VDD. Level-shifter 308 receives word-line signal WLLV and generates a corresponding VDDA-domain word-line signal WLHV. VDDA-domain word-line signal WLHV then passes to memory-cell array 322. SRAM control unit 302 also generates column-select signals C_S, which cause multiplexer 328 to select a particular pair of bit lines 324 and to connect the selected pair to sense amplifier 330 via bit lines BLT and BLB.

Meanwhile, level-shifter 306 in self-timing circuit 304 receives VDD-domain reference-word-line signal RWLLV and generates a corresponding VDDA-domain reference-word-line signal RWLHV, which propagates along self-timing row 320 and through self-timing column 312 to produce an intermediate timing signal FSA (Fire Sense Amplifier). Sense-amplifier-control unit 310 receives intermediate timing signal FSA and generates VDD-domain sense-amplifier-enable signal SOELV based thereon. Level-shifter 316 receives VDD-domain sense-amplifier-enable signal SOELV from sense-amplifier-control unit 310 and generates a corresponding VDDA-domain sense-amplifier-enable signal SOEHV. Inverter 318 then inverts VDDA-domain sense-amplifier-enable signal SOEHV and generates a corresponding inverted sense-amplifier-enable signal SOEHVB. After receiving inverted sense-amplifier-enable signal SOEHVB, sense amplifier 330 amplifies the differential data signal on selected bit lines BLT and BLB and passes amplified differential data signal DT, DC to latch 332. Finally, latch 332 latches the value of the amplified signal and produces data output signal Q.

Figure 4:
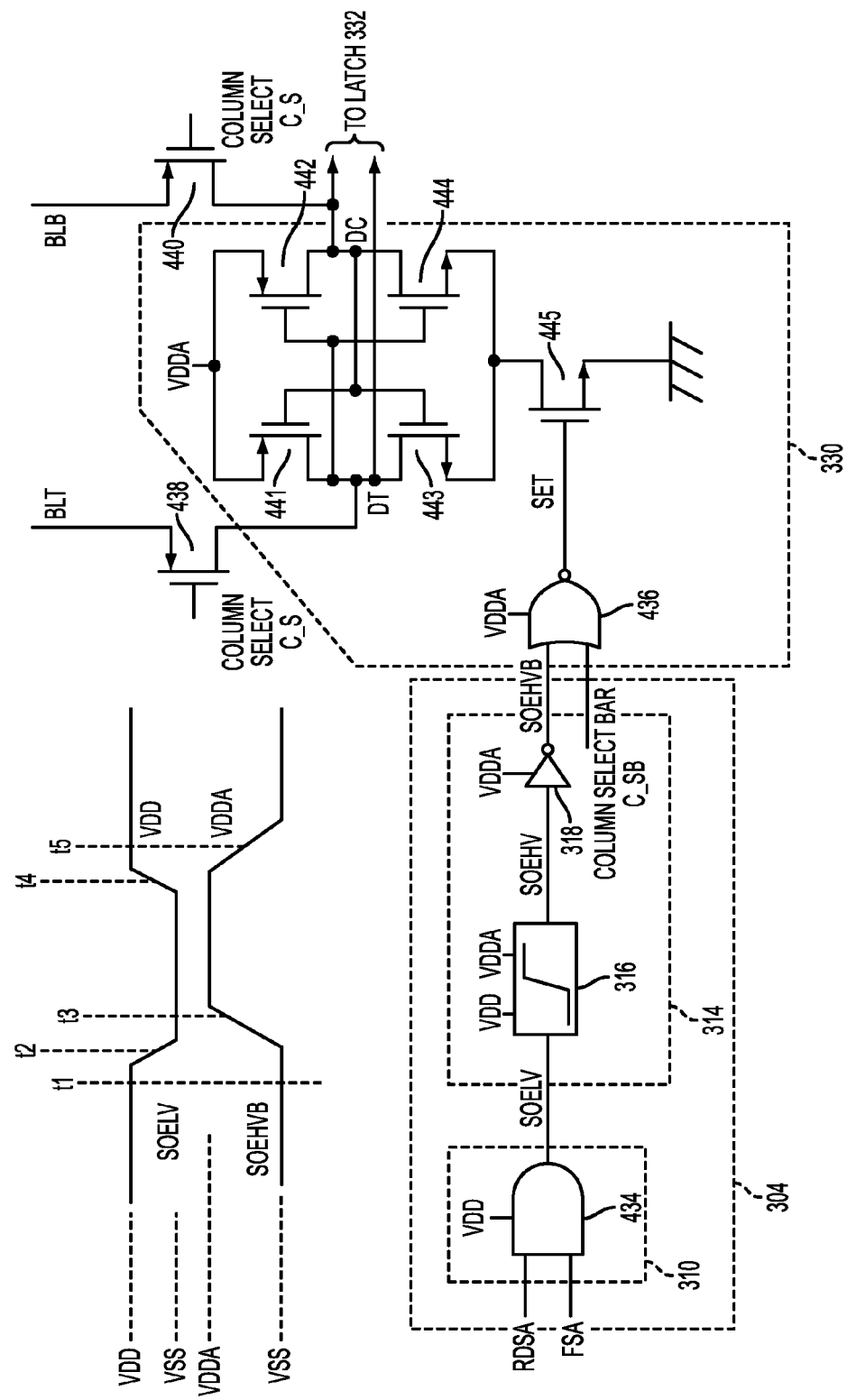
FIG. 4 is a schematic diagram depicting a self-timing circuit for the self-timed, dual-rail SRAM shown in FIG. 3.

FIG. 4 provides more detail concerning sense-amplifier-control unit 310 and sense amplifier 330. As shown in FIG. 4, sense-amplifier-control unit 310 comprises AND logic gate 434 that is powered by supply voltage VDD and configured to receive intermediate timing signal FSA and read-sense-amplifier signal RDSA, which is a signal provided by up-stream devices (not shown) along with the "read" command. Sense amplifier 330 comprises NOR gate 436 connected to a differential-signal amplifier comprising transistors 441-445.

The timing diagram in the inset of FIG. 4 illustrates the timing of signals SOELV and SOEHVB. AND logic gate 434 produces a high-level (logical "1") signal at about voltage VDD as VDD-domain sense-amplifier-enable SOELV, while both intermediate timing signal FSA and read-sense-amplifier signal RDSA are equal to (or close to) voltage VDD (e.g., at time t1, representing an ongoing "read" operation). When the ongoing "read" operation is completed, at least one of intermediate timing signal FSA and read-sense-amplifier signal RDSA is asserted "low" (e.g., equal or close to voltage VSS), then, around time t2, signal SOELV transitions from "high" (e.g., voltage VDD) to "low" (e.g., equal or close to voltage VSS or ground). After level-shifting and inversion, signal SOEHVB begins to transition from "low" to "high" (e.g., voltage VDDA). Signal SOEHVB's transition is delayed by some amount of time ΔT (e.g., time t3 minus time t2), however, due to (i) the VDD-to-VDDA voltage-levelshifting at level-shifter 316 (having a first delay Δ1) and (ii) the signal inversion at inverter 318 (having an additional delay Δ2). The total delay ΔT in the VDDA-domain sense-amplifier-enable signal SOEHVB then causes a corresponding delay in the assertion of sense-amplifier-trigger signal SET by NOR gate 436 and the subsequent activation of tail-current transistor 445. Moreover, a similar delay (e.g., from time t4 to time t5) occurs at the beginning of a read operation—i.e., when signal SOELV transitions from "low" to "high" and SOEHVB transitions from "high" to "low".

Signal SOEHVB passes to NOR logic gate 436, which receives an inverted column-select signal C_SB as a second input. In one embodiment, both signal SOEHVB and inverted column-select signal C_SB have to go "low", in order to make sense-amplifier-trigger signal SET go "high". Inverted column-select signal C_SB transitions to a "low" state before sense-amplifier-trigger signal SET transitions to a "low" state. Thus, signal SOEHVB in self-timing circuit 304 determines the time at which sense-amplifier-trigger signal SET transitions from a "low" state to a "high" state. After the de-assertion of both signal SOEHVB and inverted column-select signal C_SB, NOR logic gate 436 produces sense-amplifier-trigger signal SET, which turns on differential sense-amplifier 330 by enabling tail-current transistor 445.

Figure 5:
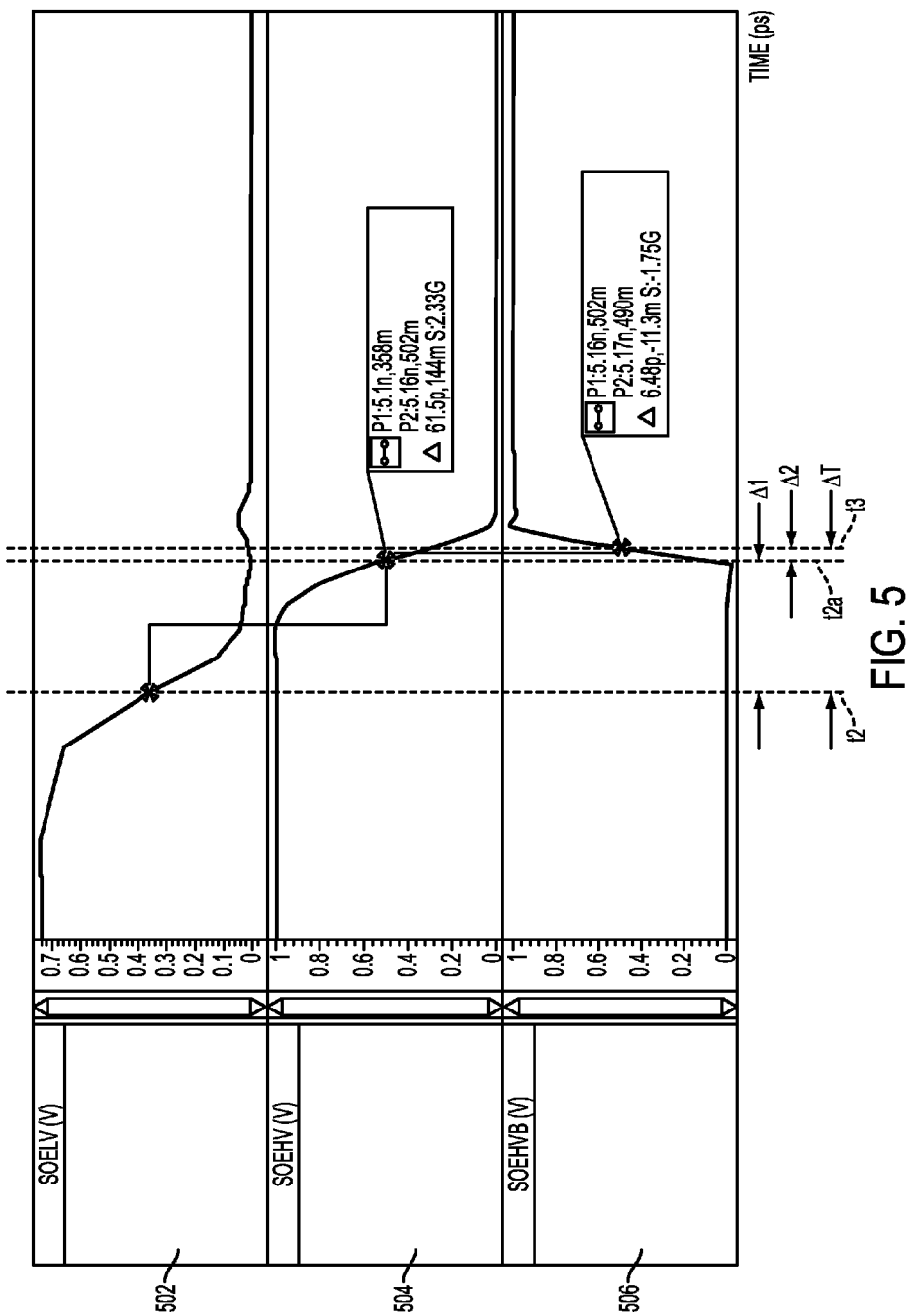
FIG. 5 is a graphical representation of simulated waveforms for certain timing signals in the self-timed, dual-rail SRAM shown in FIG. 3.

FIG. 5 illustrates, in greater detail, the timing of signals SOELV and SOEHVB, as well as intermediate signal SOEHV, in a computer simulation of the performance of self-timing circuit 304 shown in FIG. 4. In FIG. 5, signal SOELV is represented by trace 502; signal SOEHV is represented by trace 504; and signal SOEHVB is represented by trace 506. According to the simulation, the delay Δ1 caused by level-shifter 316 (from time t2 to time t2a) is about 61.5 picoseconds, while the delay Δ2 caused by inverter 318 (from time t2a to time t3) is about 6.5 picoseconds. Thus, the total delay ΔT caused by level-shifter 316 and inverter 318 in the course of switching signal SOEHVB from "low" to "high" is about 68.0 picoseconds. As a result, the timing delay from a "low"-to-"high" transition of intermediate timing signal FSA to the corresponding "low"-to-"high" transition of sense-amplifier-trigger signal SET was calculated to be about 138 picoseconds.

The inventors have recognized that the delays associated with the level-shifting and inverting in self-timing circuit 304 lead not only (i) to a performance loss in the speed of a "read" operation by SRAM 300, but also (ii) to a power loss, because the delays also cause the sense-amplifier differential voltage to be much higher, when sense amplifier 330 finally receives a sense-amplifier-enable signal. The inventors have also recognized that a conventional level-shifter also has a relatively high power loss, due to relatively high leakage currents during transitions that are attributable to the cross-linked differential latching in a conventional differential-type level-shifter.

Figure 6:
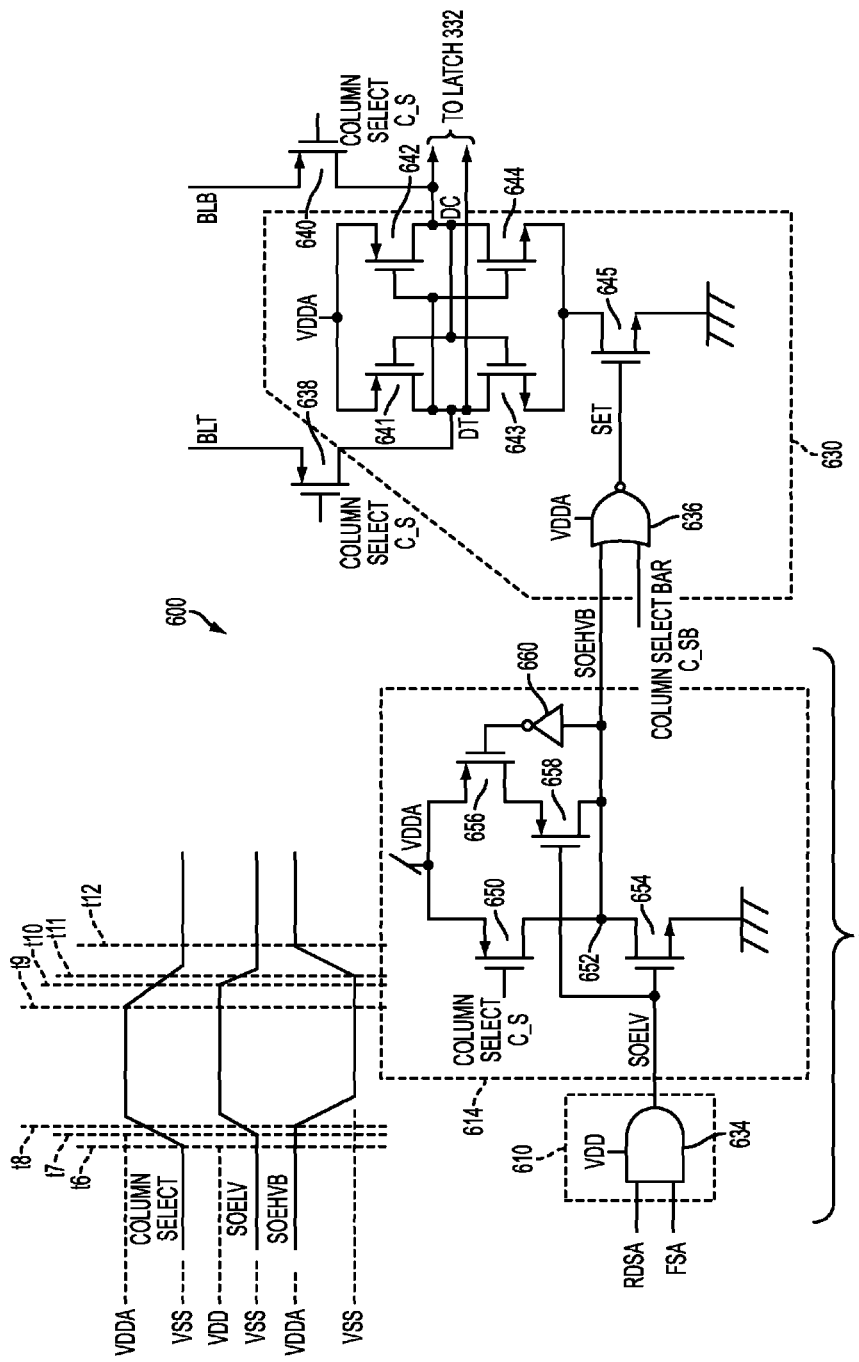
FIG. 6 is a schematic diagram depicting a self-timing circuit comprising an inverting level-shifter in a self-timed, dual-rail SRAM according to an embodiment of the invention.

FIG. 6 depicts a portion of a self-timed, dual-rail SRAM 600 in accordance with an embodiment of the invention. SRAM 600 comprises similar elements as SRAM 300, except that a novel dynamic inverting level-shifter 614 is substituted for level-shifter 316 and inverter 318, as shown in FIG. 6. Like self-timing circuit 304, self-timing circuit 604 is powered by supply voltage VDD and configured to receive intermediate timing signal FSA and read-sense-amplifier signal RDSA and to output signal SOELV. And self-timing circuit 604 similarly comprises AND logic gate 634, which produces signal SOELV as an active-high signal, as in self-timing circuit 304.

Inverting level-shifter 614 comprises complementary N-type and P-type transistors 650 and 654 connected in series between supply voltage VDDA and ground (or between supply voltage VDDA and a supply voltage VSS). Transistor 650 thus acts as a pull-up transistor, while transistor 654 is an inverting pull-down transistor. The control terminal of N-type transistor 654 is connected to signal SOELV, and the drain terminals of transistors 650 and 654 are connected together at output node 652 to produce output signal SOEHVB.

The control terminal of P-type transistor 650 is connected to a column-select signal C_S, which may be produced by a control unit (not shown) similar to control unit 302 shown in FIG. 3. For the purposes of the operation of inverting level-shifter 614, column-select signal C_S is a normally "low" signal that transitions to a "high" signal level shortly before, concurrently with, or shortly after signal SOELV transitions to a "high" signal level. For example, in one embodiment, column-select signal C_S transitions in a range of about positive 100 picoseconds to about negative 100 picoseconds from the time that signal SOELV transitions. In another embodiment, column-select signal C_S transitions in a range of about positive 50 picoseconds to about negative 50 picoseconds from the time that signal SOELV transitions. In still another embodiment, column-select signal C_S transitions in a range of about positive 25 picoseconds to about negative 25 picoseconds from the time that signal SOELV transitions. In the timing diagram shown in the inset in FIG. 6, column-select signal C_S transitions from "low" to "high" at time t1, shortly before signal SOELV is asserted.

Inverting level-shifter 614 also comprises P-type transistors 656 and 658 connected in series between supply voltage VDDA and output node 652. Series-connected transistors 656 and 658 are also connected in parallel with pull-up transistor 650. An inverter 660 is connected between output node 652 and the control terminal of transistor 656, while the control terminal of transistor 658 is connected to signal SOELV. Thus, transistor 656 effectively provides a latching function, and transistor 658 provides a latch-breaking function when a signal transition is to occur.

The operation of inverting level-shifter 614 begins with an initial signal state in which both column-select signal C_S and signal SOELV are inactive ("low"). Accordingly, N-type transistor 654 is switched "off", and P-type transistor 650 is switched "on". Output node 652 therefore has a voltage that approaches supply voltage VDDA ("high"). Inverter 660 thus produces a low voltage at the control terminal of P-type transistor 656, such that transistor 656 is switched "on". And the low state of signal SOELV also switches P-type transistor 658 to a conductive, or "on", state. Signal SOEHVB at output node 652 is therefore pre-charged to the voltage of supply voltage VDDA and latched to that state by inverter 660 and transistor 656.

With reference to the timing diagram shown in the inset in FIG. 6, at time t6, before the start of a read cycle, column-select signal C_S and signal SOELV have a "low" state, and signal SOEHVB has a "high" state. When a read operation is initiated, column-select signal C_S Column-select signal C_S preemptively (before the rise of signal SOELV) transitions from "low" to "high", while signal SOELV remains for a short period of time in a "low" state. As the voltage of column-select signal C_S falls, pull-up transistor 650 accordingly begins to turn "off" (i.e., less conductive from its drain terminal to its source terminal). As a result, after AND logic gate 634 receives a "high"-logic-level intermediate timing signal FSA in the presence of a "high"-logic-level read-sense-amplifier signal RDSA, AND logic gate 634 causes signal SOELV to begin to transition from "low" to "high" at time t7. As signal SOELV begins to transition from "low" to "high", N-type transistor 654 more easily and more rapidly transitions from a fully "off" state to a fully "on" state, with less interference from P-type transistor 650 and with less transitional leakage current through transistors 650 and 654. In addition, with the rise of signal SOELV at time t7, P-type transistor 658 becomes less conductive and switches "off". In so doing, P-type transistor 658 accelerates the breaking of the "latch" state created by the feedback loop that includes inverter 660 and P-type transistor 656. At time t8, therefore, signal SOEHVB at output node 652 transitions from "high" to "low" relatively soon after signal SOELV begins to transition.

The combination of the early transition of the column-select signal C_S and the accelerated deactivation of the latch produces a surprising improvement in the overall speed of level-shifting and inverting provided by inverting level-shifter 614. Thus, time delay $\Delta T$ between times t7 and t8 shown in the timing diagram in the inset of FIG. 6 is significantly less than the time delay between times t2 and t3 in FIG. 5). In addition, inverting level-shifter 614 has a surprising improvement (i.e., a reduction) in the transitional leakage current, because significantly less current tends to flow through P-type transistors 650 and 656 while pull-down transistor 654 transitions from one signal level to another. As a result, sense amplifier 630 receives the inverted sense-amplifier-enable signal SOEHVB much sooner than it otherwise would. For example, in one computer-based simulation, the timing delay from a "low"-to-"high" transition of intermediate timing signal FSA to the corresponding "low"-to-"high" transition of sense-amplifier-trigger signal SET was calculated to be only about 102 picoseconds, as compared with 138 picoseconds for a conventional timing circuit.

NOR logic gate 636 in sense amplifier 630 receives the inverted sense-amplifier-enable signal SOEHVB and inverted column-select signal C_SB and produces an active-high sense-amplifier-trigger signal SET. The differential-amplifier circuit comprising transistors 641-645 then amplifies the differential data signal on selected bit lines BLT and BLB and passes amplified differential data signal DT, DC to latch 332. Finally, latch 332 latches the value of the amplified signal and produces data output signal Q. Thus, the improved speed of the level-shifting and inverting provided by inverting level-shifter 614 carries through to improve the overall performance of SRAM 600.

As noted above, before time t9 in the timing diagram inset in FIG. 6, both column-select signal C_S and signal SOELV are active ("high"). Accordingly, N-type transistor 654 is "on", and P-type transistor 650 is "off". Output node 652 therefore has a voltage that approaches supply voltage VSS ("low") (or ground). Inverter 660 thus produces a "high" control signal at the control terminal of P-type transistor 656, such that transistor 656 is switched "off". The high state of signal SOELV also places P-type transistor 658 in a non-conductive, or "off", state. Signal SOEHVB at output node 652 is therefore pre-charged to the voltage of supply voltage VSS (or ground) and latched to that state by inverter 660 and transistor 656.

At time t9, after the read operation is completed, column-select signal C_S transitions from "high" to "low", and inverted column-select signal C_SB transitions from "high" to "low". NOR logic gate 636 therefore causes sense-amplifier-trigger signal SET to transition from "high" to "low", and sense amplifier 630 is disabled. In addition, P-type transistor 650 begins to transition from a non-conductive state to a conductive state, which begins raising the voltage of signal SOEHVB.

At time t10, after at least one of intermediate timing signal FSA and read-sense-amplifier signal RDSA transitions from "high" to "low", signal SOELV begins to transition from "high" to "low". Pull-down N-type transistor 654 begins to turn "off" and thereby contributes to raising the voltage of signal SOEHVB at time t11. In addition, with the fall of signal SOELV, P-type transistor 658 becomes more conductive and switches "on", and, as signal SOEHVB rises, the voltage at the control terminal of P-type transistor 656 inversely follows the rising voltage (due to inverter 660). P-type transistor 656 therefore becomes conductive, and a "latch" condition is created by positive feedback in the feedback loop comprising P-type transistors 656 and 658 and inverter 660. After the switching is completed, e.g., at time t12, therefore, signal SOELV and column-select signal C_S are "low", and SOEHVB is "high".

Figure 7:
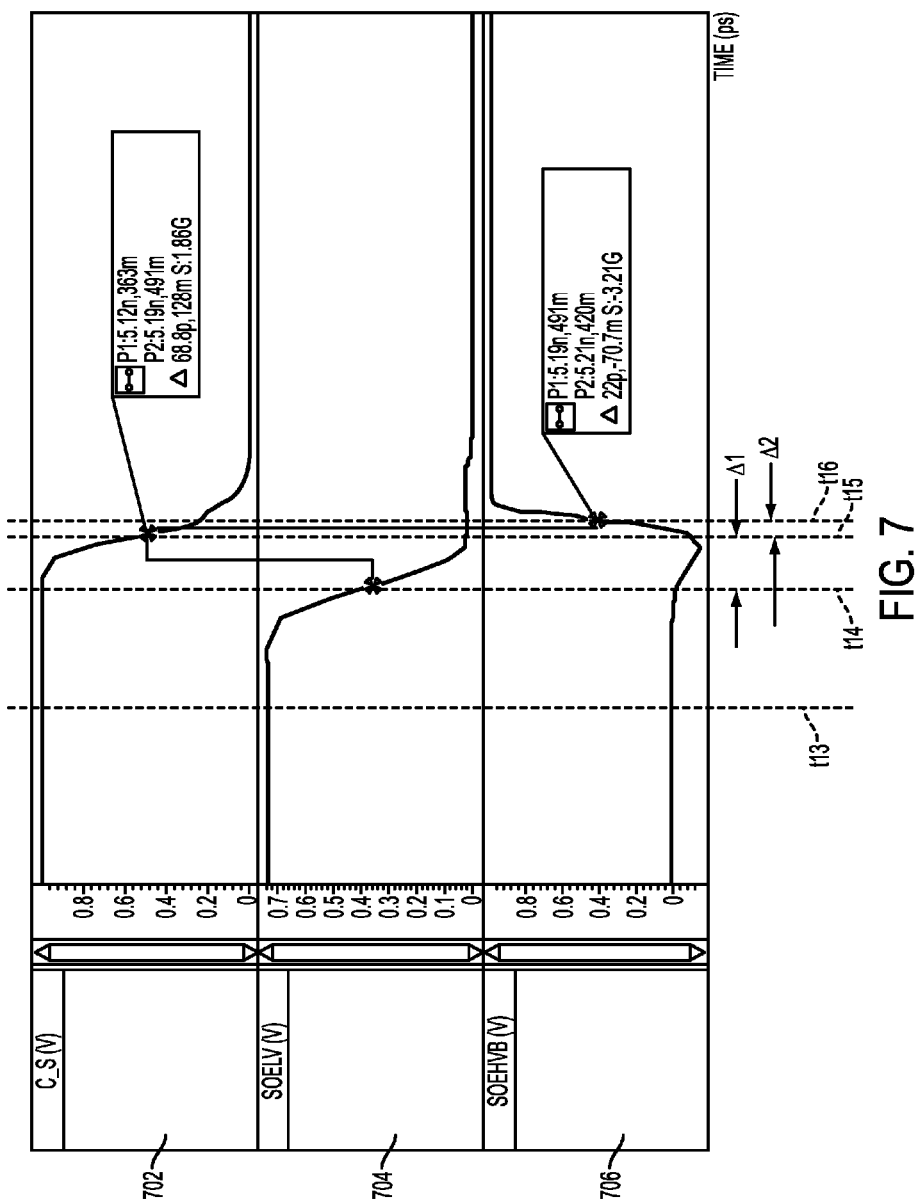
FIG. 7 is a graphical representation of simulated waveforms for corresponding timing signals in the self-timed, dual-rail SRAM shown in FIG. 5.

FIG. 7 provides an example of a high-to-low transition for signal SOELV in self-timing circuit 604 in an embodiment of the invention in which column-select signal C_S transitions shortly after signal SOELV transitions. Column-select signal C_S is represented by trace 702; signal SOELV is represented by trace 704; and signal SOEHVB is represented by trace 706. In the example shown in FIG. 7, in an initial state at time t13, both column-select signal C_S and signal SOELV are active ("high"). Accordingly, N-type transistor 654 is switched "on", and P-type transistor 650 is switched "off". Output node 652 therefore has a voltage that approaches supply voltage VSS ("low") (or ground). Inverter 660 thus produces a high voltage at the control terminal of P-type transistor 656, such that transistor 656 is switched "off". And the high state of signal SOELV also switches P-type transistor 658 to a non-conductive, or "off", state. Signal SOEHVB at output node 652 is therefore pre-charged to the voltage of supply voltage VSS (or ground) and latched to that state by inverter 660 and transistor 656.

At time t14, signal SOELV transitions from "high" to "low", while column-select signal C_S remains for a short period of time (e.g., after a delay $\Delta 1$ of about 68.8 picoseconds) in a "high" state. Pull-down N-type transistor 654 therefore begins to turn "off". As a result, at time t15, when column-select signal C_S transitions from "high" to "low", P-type transistor 650 more easily and more rapidly transitions from a fully "off" state to a fully "on" state (e.g., after a very short delay 42 of about 22 picoseconds), with less interference from N-type transistor 654 and with less transitional leakage current through transistors 650 and 654. At time t16, therefore, signal SOEHVB at output node 652 transitions from "low" to "high" relatively soon after signal SOELV begins to transition (for a total delay $\Delta T$ of about 90.8 picoseconds, to achieve a signal transition of sense-amplifier-trigger signal SET from "high" to "low").

In addition, with the fall of signal SOELV at time t14, P-type transistor 658 becomes more conductive and switches "on". The voltage at the control terminal of P-type transistor 656 inversely follows the rising voltage at signal SOEHVB (due to inverter 660) and finally creates a "latch" state due to the feedback loop comprising inverter 660 and P-type transistors 656 and 658.

Figure 8:
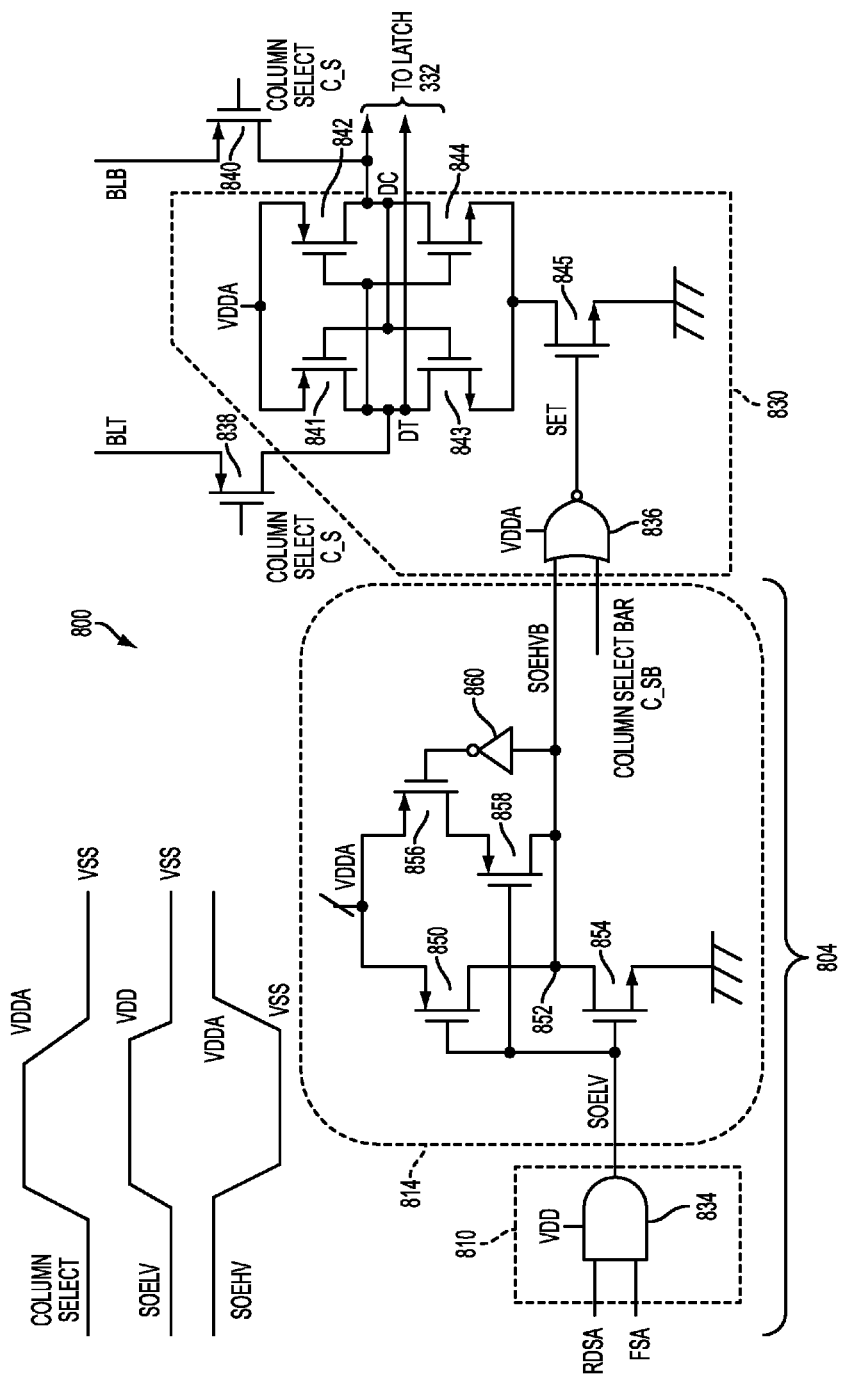
FIG. 8 is a schematic diagram depicting another self-timing circuit comprising an inverting level-shifter according to another embodiment of the invention.

FIG. 8 depicts SRAM 800 in accordance with another embodiment of the invention. The elements of SRAM 800 are similar to those of SRAM 600 shown in FIG. 6, but, in SRAM 800, the control terminal of transistor 850 is connected to signal SOELV, rather than to column-select signal C_S. SRAM 800 operates similarly to SRAM 600, but transistor 850 switches concurrently with transistors 854 and 858. A read operation in SRAM 800 thus tends to be completed slightly slower than SRAM 600, and SRAM 800 has a greater leakage current during transitions.

While the exemplary embodiments of the present invention have been described with respect to processes of circuits, including possible implementation as a single integrated circuit, a multi-chip module, a single card, or a multi-card circuit pack, the present invention is not so limited.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the terms "control node" and "control terminal" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. An integrated memory circuit comprising:
   a sense-amplifier control circuit connected to a first supply voltage and configured to receive a first timing signal and to produce a second timing signal having a first maximum voltage based on the first timing signal;
   an inverting level-shifter connected to the sense-amplifier control circuit and configured to produce a third timing signal that (i) inversely corresponds to the second timing signal and (ii) has a second maximum voltage; and
   a sense amplifier connected to (i) a second supply voltage, (ii) the inverting level-shifter, and (iii) at least one bit line, and configured to amplify a bit-line signal based on the third timing signal.

2. The integrated memory circuit of claim 1, further comprising:
   a non-inverting level-shifter configured to receive a first reference word-line signal having the first maximum voltage and to produce a corresponding second reference word-line-signal having the second maximum voltage;
   at least one of (i) a self-timing row and (ii) a self-timing column connected between the non-inverting level-shifter and the sense-amplifier control circuit.

3. The integrated memory circuit of claim 1, wherein the sense-amplifier control circuit comprises an AND logic gate configured to produce the second timing signal based on the first timing signal.

4. The integrated memory circuit of claim 1, wherein the sense amplifier comprises a NOR logic gate connected to the inverting level-shifter and configured to produce a sense-amplifier-trigger signal based on the third timing signal.

5. The integrated memory circuit of claim 1, wherein the inverting level-shifter comprises:
   a first transistor that is (i) configured to receive the second timing signal and (ii) connected between a first supply voltage and an output node;
   a second transistor connected to a second supply voltage and to the first transistor at the output node;
   a third transistor connected in series with a fourth transistor, the third and fourth transistors being connected between the second supply voltage and the output node in parallel with the second transistor; and an inverter connected between the output node and the control terminal of the third transistor, wherein the inverting level-shifter is configured to produce the third signal at the output node.

6. The integrated memory circuit of claim 5, wherein the control terminal of the second transistor is connected to a column-select signal in an integrated memory circuit.

7. The integrated memory circuit of claim 5, wherein the control terminal of the second transistor is configured to receive the second timing signal.

8. The integrated memory circuit of claim 5, wherein the control terminal of the fourth transistor is configured to receive the second timing signal.

9. The integrated memory circuit of claim 5, wherein either (i) the first transistor is an N-type transistor and the second, third, and fourth transistors are P-type transistors, or (ii) the first transistor is a P-type transistor and the second, third, and fourth transistors are N-type transistors.

10. A method for controlling sense-amplifier timing in an integrated memory circuit, the method comprising:
a sense-amplifier control circuit receiving a first timing signal and producing a second timing signal having a first maximum voltage based on the first timing signal;
an inverting level-shifter producing a third timing signal that (i) inversely corresponds to the second timing signal and (ii) has a second maximum voltage; and
a sense amplifier amplifying a bit-line signal based on the third timing signal.

11. The method of claim 10, further comprising:
a non-inverting level-shifter receiving a first reference word-line signal having the first maximum voltage and producing a corresponding second reference word-line-signal having the second maximum voltage; and
at least one of (i) a self-timing row and (ii) a self-timing column connected between the non-inverting level-shifter and the sense-amplifier control circuit receiving the first reference word-line signal and producing the first timing signal based on the first reference word-line signal.

12. The method of claim 10, wherein an AND logic gate in the sense-amplifier control circuit produces the second timing signal based on the first timing signal.

13. The method of claim 10, wherein a NOR logic gate in the sense amplifier receives the third timing signal from the inverting level-shifter and produces a sense-amplifier-trigger signal based on the third timing signal.

14. The method of claim 10, wherein the step of the inverting level-shifter producing the third timing signal comprises:
a first transistor connected between a first supply voltage and an output node receiving the second timing signal,
a second transistor connected to a second supply voltage and to the first transistor at the output node receiving a first control signal;
a third transistor that is (i) connected in series with a fourth transistor between the first supply voltage and the output node and (ii) in parallel with the second transistor, in combination with the fourth transistor, receiving a second control signal inversely corresponding to the third timing signal;
the fourth transistor also receiving the second timing signal; and
an inverter receiving the third timing signal and producing the second control signal for the third transistor based on the third timing signal, wherein the first, second, third, and fourth transistors are configured to output the third signal at the output node.

15. The method of claim 14, wherein the control terminal of the fourth transistor receives the second timing signal.

16. An inverting level-shifter, comprising:
a first transistor that is (i) configured to receive a first signal having a first maximum voltage supplied from a first supply voltage and (ii) connected between the second supply voltage and an output node;
a second transistor connected to a second supply voltage and to the first transistor at the output node;
a third transistor connected in series with a fourth transistor, the combination of the third and fourth transistors being connected between the second supply voltage and the output node in parallel with the second transistor;
an inverter connected between the output node and the control terminal of the third transistor, wherein:
the inverting level-shifter is configured to produce a second signal that inversely corresponds to the first signal and has a second maximum voltage.

17. The inverting level-shifter of claim 16, wherein the control terminal of the second transistor is connected to a column-select signal in an integrated memory circuit.

18. The inverting level-shifter of claim 16, wherein the control terminal of the second transistor is also configured to receive the first signal.

19. The inverting level-shifter of claim 16, wherein the control terminal of the fourth transistor is also configured to receive the first signal.

20. The inverting level-shifter of claim 16, wherein either (i) the first transistor is an N-type transistor and the second, third, and fourth transistors are P-type transistors, or (ii) the first transistor is a P-type transistor and the second, third, and fourth transistors are N-type transistors.

* * * * *